United States Patent
Sundby

(10) Patent No.: US 7,816,958 B2
(45) Date of Patent: Oct. 19, 2010

(54) MEANS TO REDUCE THE PLL PHASE BUMP CAUSED BY A MISSING CLOCK PULSE

(75) Inventor: James Toner Sundby, Tracy, CA (US)

(73) Assignee: Exar Corporation, Fremont, CA (US)

( * ) Notice: Subject to any disclaimer, the term of this patent is extended or adjusted under 35 U.S.C. 154(b) by 790 days.

(21) Appl. No.: 11/744,420

(22) Filed: May 4, 2007

(65) Prior Publication Data

US 2008/0273648 A1 Nov. 6, 2008

(51) Int. Cl.
*H03L 7/06* (2006.01)
(52) U.S. Cl. .................. 327/156; 327/147; 327/157; 327/158; 327/161
(58) Field of Classification Search .............. 327/147, 327/156, 157
See application file for complete search history.

(56) References Cited

U.S. PATENT DOCUMENTS

| | | | |
|---|---|---|---|
| 6,744,838 B1 | 6/2004 | Dixit | |
| 7,646,224 B2 | 1/2010 | Sundby | |
| 7,659,760 B2 * | 2/2010 | Doi | ............... 327/157 |
| 2005/0110526 A1 | 5/2005 | Ishibashi et al. | |

OTHER PUBLICATIONS

Notice of Allowance for U.S. Appl. No. 11/744,386, mailed on Aug. 24, 2009, 6 pages.
Non-Final Office Action for U.S. Appl. No. 11/744,386, mailed on Dec. 18, 2008, 7 pages.
Non-Final Office Action for U.S. Appl. No. 11/744,386, mailed on Jul. 1, 2008, 6 pages.
Non-Final Office Action for U.S. Appl. No. 12/625,406, mailed on Jul. 16, 2010, 10 pages.

* cited by examiner

*Primary Examiner*—Lincoln Donovan
*Assistant Examiner*—John W Poos
(74) *Attorney, Agent, or Firm*—Townsend and Townsend and Crew LLP

(57) ABSTRACT

A PLL includes control circuitry adapted to detect missing pulses of a reference clock and to control an output voltage of a charge pump disposed in the PLL accordingly. A signal generated in response to the detection of a missing pulse is pulse-width limited and applied to the charge pump during a first period. The detection of the pulse-width limited signal is used to generate a first slew signal that is also pulse-width limited and applied to the charge pump during a second period. The detection of the first slew signal is used to generate a second slew signal that is also pulse-width limited and applied to the charge pump during a third period. The amount of current supplied by the charge pump during the second charging period is equal to a sum of currents withdrawn by the charge pump during the first and third time periods.

8 Claims, 6 Drawing Sheets

MEANS TO REDUCE THE PLL PHASE BUMP CAUSED BY A MISSING CLOCK PULSE

CROSS-REFERENCE TO RELATED APPLICATIONS

The present application is related to co-pending U.S. application Ser. No. 11/744,386, filed May 4, 2007, entitled "Means To Detect A Missing Pulse And Reduce The Associated PLL Phase Bump," the contents of which is incorporated herein by reference in its entirety.

BACKGROUND OF THE INVENTION

The present invention relates to electronic circuits, and more particularly to controlling the phase bump a phased locked loop.

A phase locked loop maintains a fixed relationship between the phase and frequency of the signal it receives and those of the signal it generates. FIG. 1 is a simplified block diagram of a conventional phase locked loop (PLL) 10 adapted to maintain a fixed relationship between the phase and frequency of signal CLK and signal REF. PLL 10 includes, among other components, phase detector 12, charge pump 14, loop filter 16 and voltage controlled oscillator (VCO) 18. The extracted clock signal Clk is supplied at the output terminal of VCO 18. The operation of PLL 10 is described further below.

Phase detector 12 receives signals REF and Clk, and in response, generates signals UP and DN that correspond to the difference between the phases of the signals REF and Clk. Charge pump 14 receives signals UP and DN and in response varies the current it supplies to node Vcntrl. Loop filter 16 stores the charge as a voltage, which is then delivered to VCO 18.

If signal REF leads signal Clk in phase—indicating that the VCO is running relatively slowly—the duration of pulse signal UP increases, thereby causing charge pump 14 to increase its net output current I until VCO 18 achieves an oscillation frequency at which signal Clk is frequency-locked and phase-locked with signal REF. If, on the other hand, signal REF lags signal Clk in phase—indicating that the VCO is running relatively fast—the duration of pulse signal DN increases—thereby causing VCO 18 achieve an oscillation frequency at which signal Clk is frequency-locked and phase-locked with signal REF. Signal Clk is considered to be locked to signal REF if its frequency is within a predetermined frequency range of signal REF and the phase of signals CLK and REF are aligned. Signal Clk is considered to be out-of-lock with signal REF if its frequency is outside the predetermined frequency range of signal REF.

When the input reference clock to a PLL changes phase, the PLL must slew to the new phase. Such a condition may happen when, for example, the PLL switches from one reference clock to another clock with the same frequency but a different phase. Such a condition may also happen if the clock that the PLL switches to has a different frequency than the clock the PLL switches from. Furthermore, in some applications it is desirable to have the PLL output clock switch slowly, and not rapidly, to the new phase so as to enable other down-stream circuits to maintain proper operation.

When the input clock to a PLL misses a pulse or becomes inactive, the output of the Phase-Frequency detector 12 gets stuck in the down state until such time as the input clock becomes active again. Referring to FIGS. 1 and 2 concurrently, a clock signal, such as $REF_{ideal}$, applied to a PLL ideally should not have missing pulses. However, in practical applications, a clock signal such as $REF_{actual}$, actually received by a PLL includes missing pulses. The phase of the feedback signal CLK generated in response to clock signal $REF_{actual}$ begins to vary as a result of the missing pulses. These phase shifts $\Delta\phi_1$ and $\Delta\phi_2$ are shown in FIG. 2 relative to the ideal clock signal $REF_{ideal}$.

When signal DN remains in a high state as a result of the missing pulses, the charge pump disposed in the PLL starts to remove charge from the loop filter. This causes signal Vcntrl generated by charge pump 14 to droop, in turn causing the VCO output phase to move away from its ideal value.

In accordance with one known technique, such as that described in U.S. Pat. No. 6,483,389, phase-frequency detector 12 is reset to prevent an extended output pulse. At best, such a technique would reset the phase-frequency detector 12 one half cycle after the missing pulse. The technique also fails to provide a compensating pulse to cancel the initial error pulse. For example, if a missing pulse on the input clock causes signal DN to be active for an extended period, no compensating UP pulse is generated to supply the charges removed in response to signal DN.

In accordance with another prior art technique, such as that described in U.S. Pat. No. 6,590,949, signal DN is pulse-width limited to limit its duration. A missing pulse detection circuit that compares the CLK input to the feedback clock, creates a compensating UP pulse to cancel out the DN pulse, as shown in FIG. 3. However, the compensating pulse takes several clock cycles to arrive, during which time the phase error continues to accumulate. Also, while the UP pulse returns the voltage input to the VCO back to normal, it does not return the phase output of the VCO back to normal, in other words, it simply stops further phase error from accumulating.

BRIEF SUMMARY OF THE INVENTION

A PLL, in accordance with one embodiment of the present invention, includes control circuitry adapted to detect missing pulses of a reference clock and to control an output voltage of a charge pump disposed in the PLL. A signal generated in response to the detection of a missing pulse is subsequently pulse-width limited and applied to the charge pump during a first period. The detection of the pulse-width limited signal is used to generate a first slew signal that is subsequently pulse-width limited and applied to the charge pump during a second charging period. The detection of the first slew signal is used to generate a second slew signal that is also subsequently pulse-width limited and applied to the charge pump during a third charging period. The amount of current supplied by the charge pump during the second charging period is equal to a sum of currents withdrawn by the charge pump during the first and third time periods.

In accordance with another embodiment of the present invention, a control circuitry disposed in a PLL generates a pair of pulse-width limited signals in response to detecting missing pulses of a reference clock. The second pulse width limited signal is generated immediately after the first pulse-width limited signal. During the second pulse-width limited signal, a charge pump disposed in the PLL causes an output signal of the charge pump to increase by an amount equal to an amount by which the output signal of the charge pump decreases during the first pulse-width limited signal.

DETAILED DESCRIPTION OF THE INVENTION

In accordance with one embodiment of the present invention, to reduce a PLL phase bump caused by a missing clock pulse, a compensating pulse-width limited UP signal is generated immediately after the pulse-width limited DN signal is detected as being stuck in an active state as a result of the missing clock pulse. Since the compensating UP pulse is generated immediately after the DN pulse, a minimal phase error is incurred. In accordance with another embodiment of the present invention, after the DN signal is pulse-width limited, in part, as a result of a missing clock pulse, an UP pulse having a current that is twice the normal current is immediately generated. Thereafter, a second DN pulse having a normal current immediately follows the UP pulse, thereby causing the VCO to remove the phase error, so as to reduce the final phase error to nearly zero.

Figure 1:
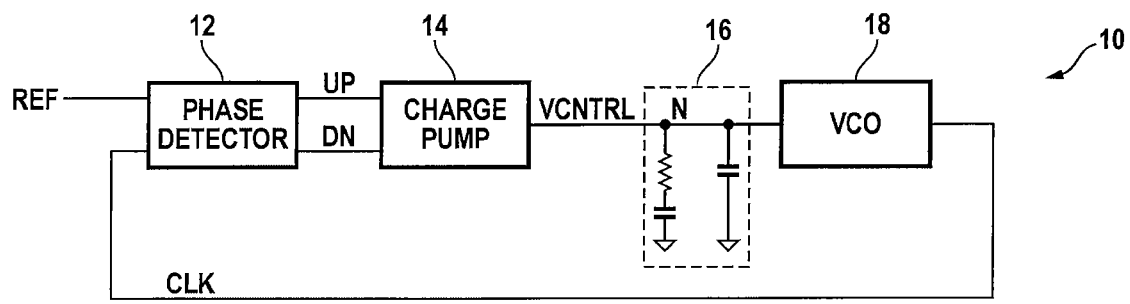
FIG. 1 is a block diagram of a PLL, as known in the prior art.
Figure 2:
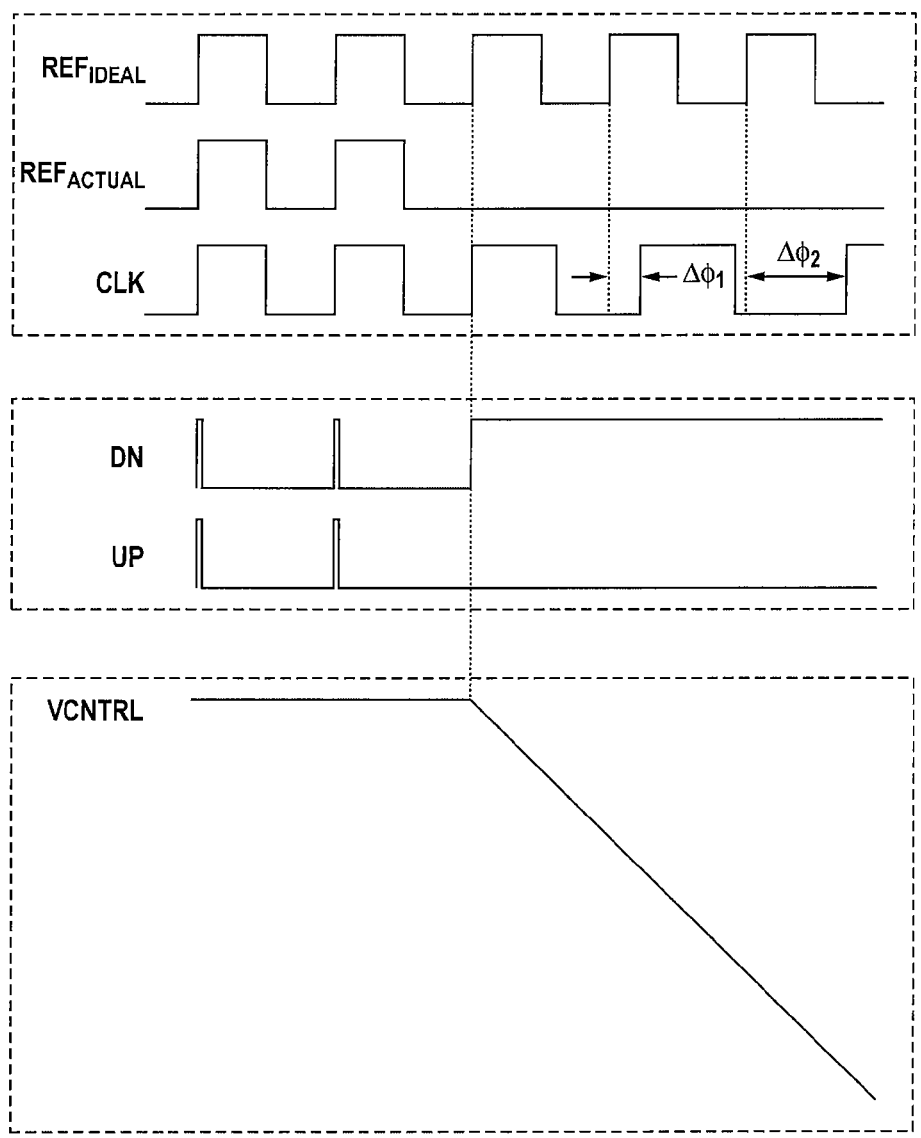
FIG. 2 is a timing diagram of a number of signal associated with the PLL of FIG. 1.
Figure 3:
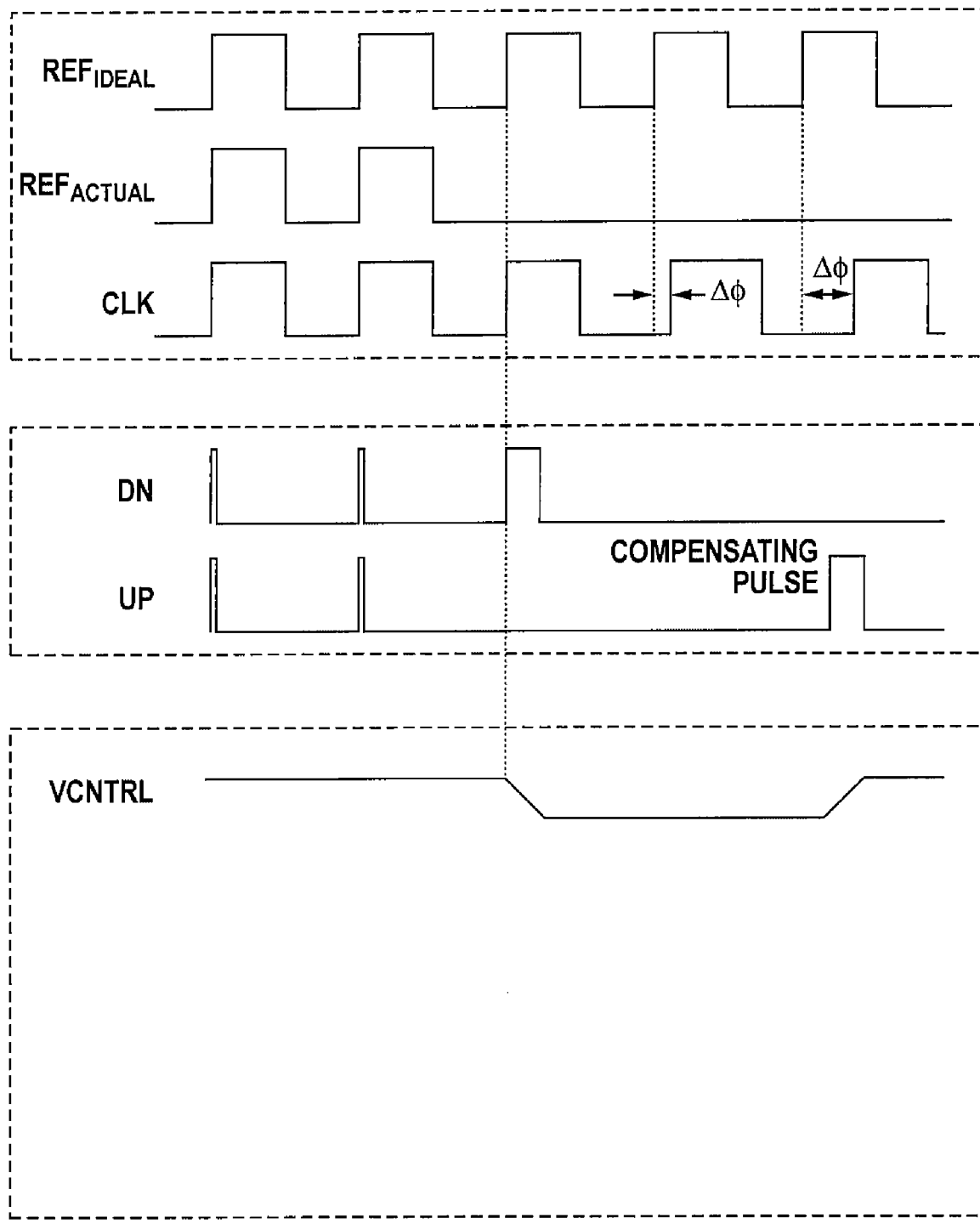
FIG. 3 is a timing diagram of a number of signal associated with a prior art PLL that generates an UP pulse a number of clock cycles after generating a DN pulse.
Figure 4:
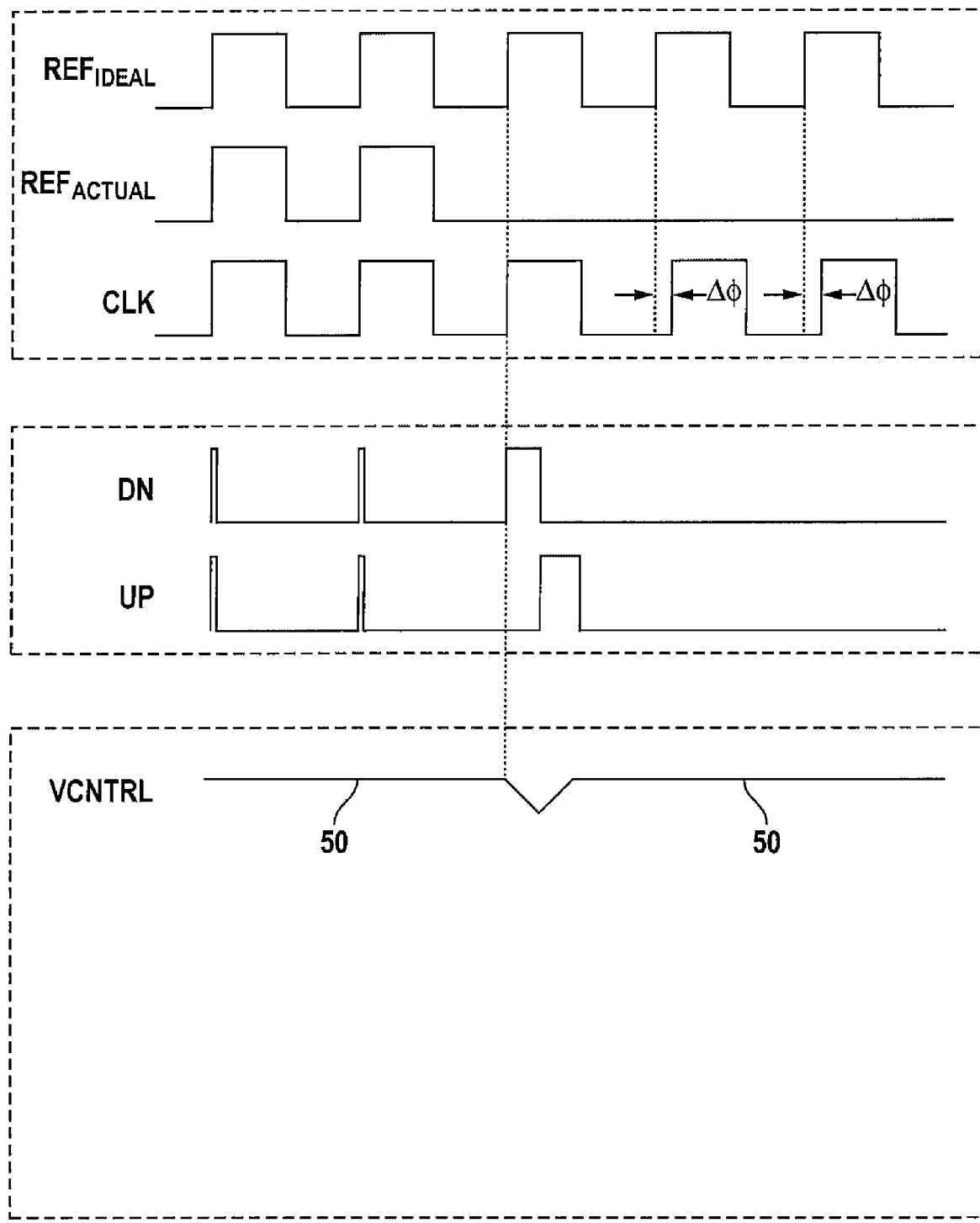
FIG. 4 is a timing diagram of a number of signal associated with a PLL, in accordance with one embodiment of the present invention.

FIG. 4 is a timing diagram of a number of signal associated with a PLL, in accordance with one embodiment of the present invention. Ideally, the clock signal applied to the PLL, namely clock signal $REF_{ideal}$ should not have missing pulses. In practical applications, the clock signal $REF_{actual}$ actually received by the PLL includes missing pulses. Clock signal CLK is generated by the PLL. As shown in FIG. 4, in accordance with one embodiment of the present invention, a compensating pulse-width limited UP pulse is generated immediately after the pulse-width limited DN signal is deasserted. In other words, the compensating UP pulse is generated in response to the same conditions that deassert pulse DN and during the same cycle of clock signal CLK. As is also seen from FIG. 4, as a result of generating a compensating UP pulse immediately after the termination of the DN pulse, the output signal Vcntrl of the charge pump returns to its normal level, i.e., the same level 50 it had prior to occurrence of missing pulses on signal $REF_{actual}$.

In accordance with the present invention, the compensating UP pulse is created without the use of the feedback clock. To accomplish this, a monitoring (control) circuit monitors the output signal DN of the phase-frequency detector in order to determine if the DN signal has been pulse-width limited or not. If signal DN has been pulse width limited, a compensating UP pulse is created. Since normal conditions like a PLL lock-in condition may also produce a pulse-width limited signal DN, the compensating UP pulse is generated only if a predetermined number of cycles of the feedback clock are passed without detecting any pulse width limitation. This may occur when the PLL is locked without detecting a missing pulse.

Figure 5:
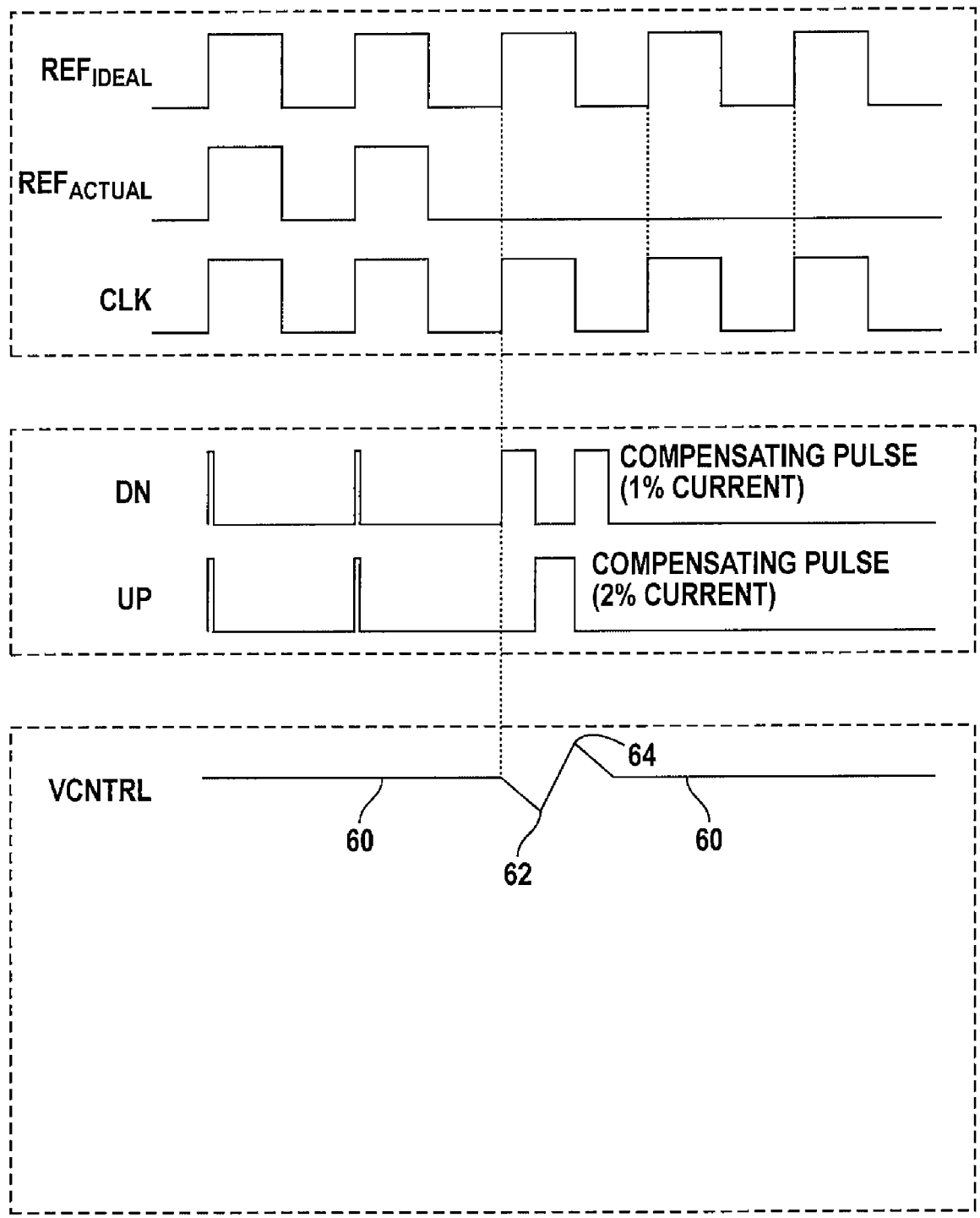
FIG. 5 is a timing diagram of a number of signal associated with a PLL, in accordance with another embodiment of the present invention.

FIG. 5 is a timing diagram of a number of signal associated with a PLL, in accordance with another embodiment of the present invention. In accordance with this embodiment, following the detection of a DN pulse as a result of a missing pulse condition, an UP pulse is immediately created. The current used by the charge pump during the UP pulse may be twice the amount of current during the previous DN pulse period. After the expiration of the UP pulse, a second DN pulse is generated. During the second DN pulse, the current generated by the charge pump is the same as that generated during the first DN pulse. Therefore, the sum of the currents generated during the two DN pulses, is the same as that generated during the UP pulse. In other embodiments, a multitude of DN pulses, $K_1$, and a multitude of UP pulses, $K_2$ may be used, where the sum of currents during the $K_1$ DN pulses is equal to the sum of currents during the $K_2$ Up pulses. In response to first DN pulse, signal Vctnrl goes from level 60 to 62. In response to the UP pulse, signal Vctnrl goes from level 62 to level 64. In response to the second DN pulse, signal Vctnrl goes from level 64 to level 60. The difference between levels 64 and 60 is the same as that between levels 62 and 60. While at level 64, the VCO is running faster than normal, thereby allowing the phase to catch up again, i.e., it removes the phase error.

Figure 6:
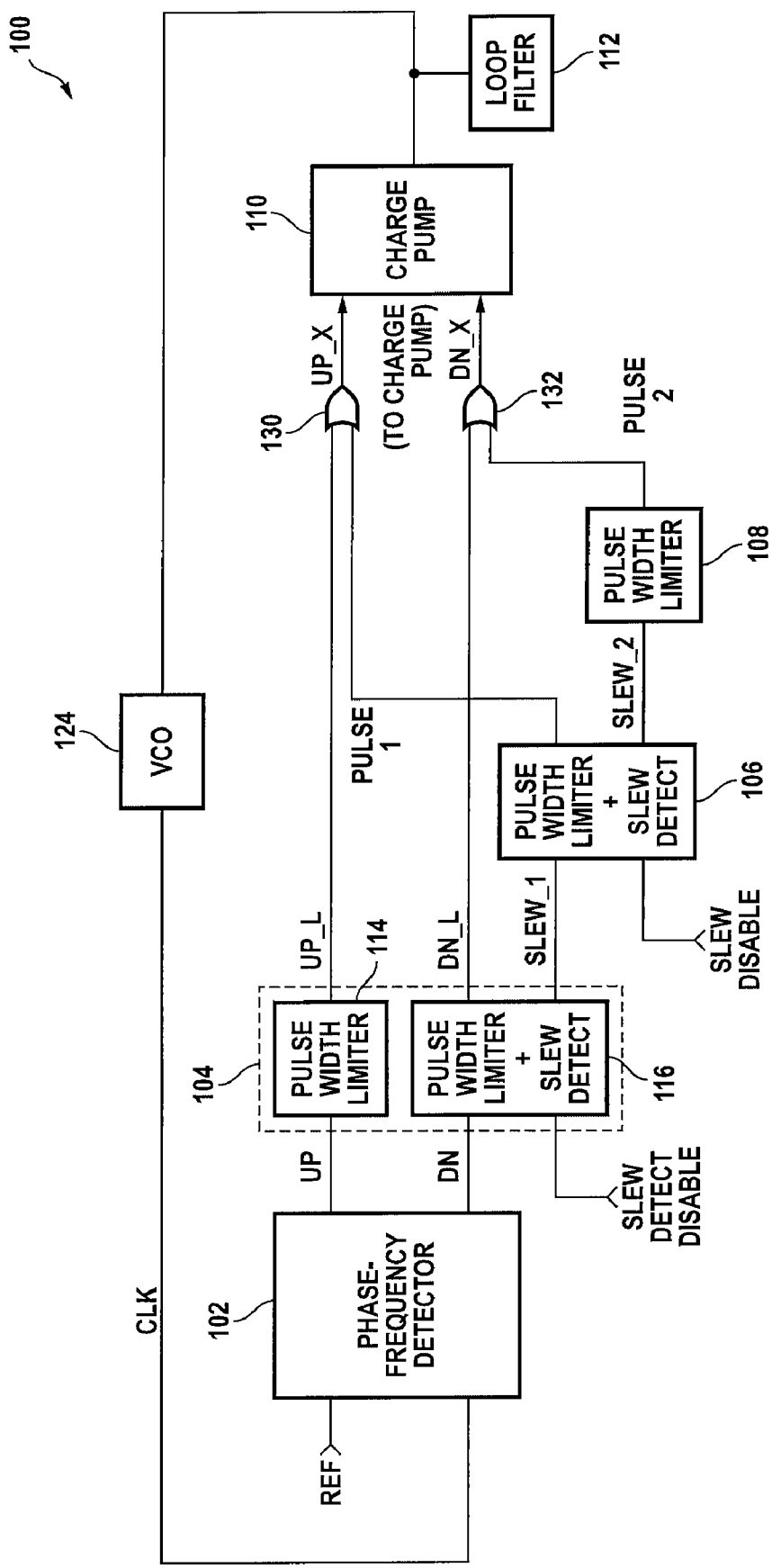
FIG. 6 is a block diagram of a PLL, in accordance with one exemplary embodiment of the present invention.
Figure 7:
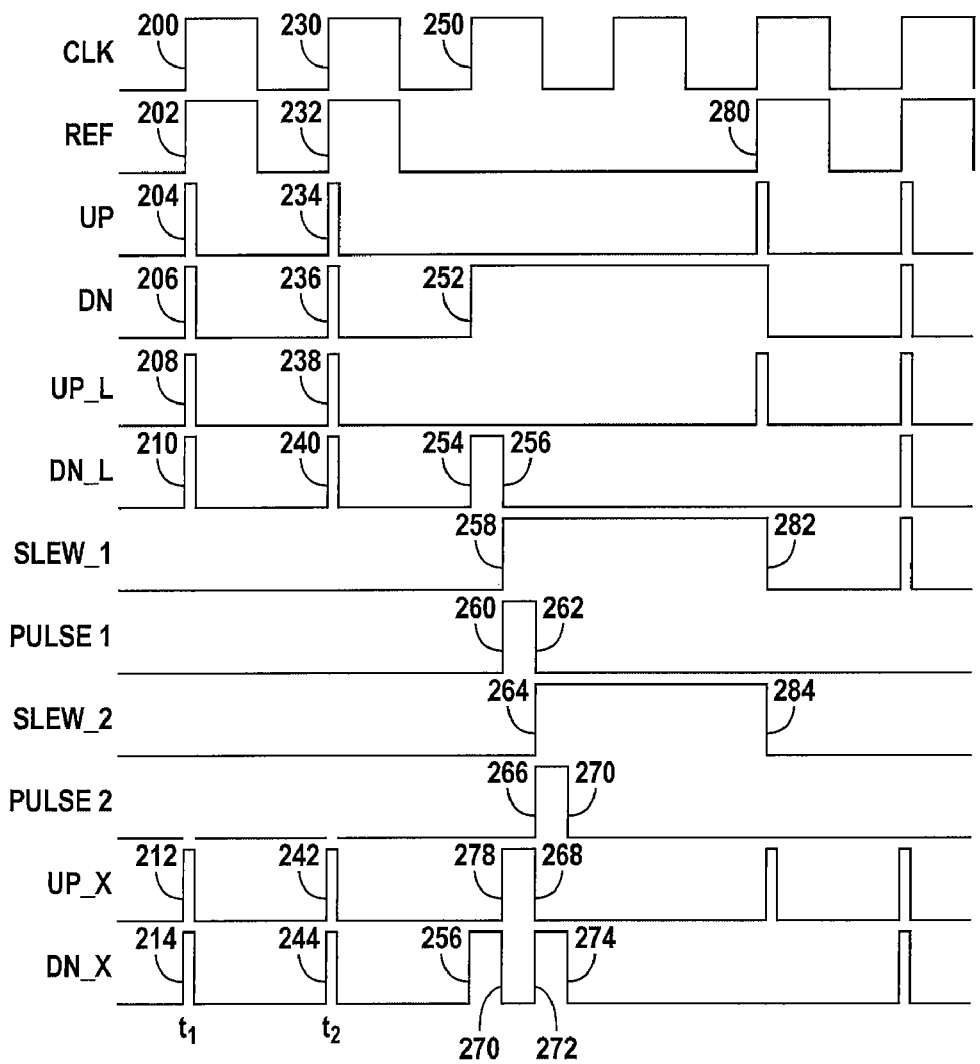
FIG. 7 is a block diagram of a number of signal associated with the PLL of FIG. 6.

FIG. 6 is a block diagram of a PLL 100, in accordance with one embodiment of the present invention. FIG. 7 is a timing diagram of various signals associated with PLL 100. Concurrent references are made in the following to FIGS. 6 and 7. Phase/frequency detector 102 receives reference clock signal REF and feedback clock signal CLK generated by VCO 124. Reference clock signal REF is shown as having missing pulses. Because transitions 200 and 202 of signals CLK and REF are aligned, phase/frequency detector 102 generates both UP and DN pulses 204, 206. Block 104 includes a pulse-width limiter 114 as well as pulse-width limiter and slew-detector 116. Pulse-width limiter 114 limits the pulse width of signal UP to generate signal UP_L 208. Similarly, pulse-width limiter and slew-detector 116 limits the pulse width of signal DN to generate signal DN_L 210. Output signal UP_X of OR gate 130 goes high 212 in response to the high level of signal UP_L. Similarly, output signal DN_X of OR gate 132 goes high 214 in response to high level of signal DN_L.

Similarly, because transitions 230 and 232 of signals CLK and REF are aligned, phase/frequency detector 102 generates both UP and DN pulses 234, 236. Pulse-width limiter 114 limits the pulse width of signal UP to generate signal UP_L 238. Similarly, pulse-width limiter and slew-detect 116 limits the pulse width of signal DN to generate signal DN_L 240. Output signal UP_X of OR gate 130 goes high 242 in response to the high level of signal UP_L. Similarly, output signal DN_X of OR gate 132 goes high 244 in response to high level of signal DN_L.

Since there is no transition on signal REF during the next two cycles of signal CLK, signal DN goes high in response to transition 250 of signal CLK. Accordingly, pulse width limiter and slew detect 116 generates a pulse signal DN_L identified by transitions 254 and 256. The pulse DN_L also appears as a pulse on signal DN_X identified by transitions 256 and 270.

Signal Slew_1 also generated by pulse width limiter and slew detect 116 goes high 258 in response to the falling edge 256 of signal DN_L. Signal Slew_1 remains high until transition 280 appears on signal REF. In response to transition 280, signal Slew_1 goes low 282. Pulse-width limiter and slew detect 106 limits the pulse-width of signal Slew_1 to generate pulse-width limited signal Pulse_1, identified by transitions 260 and 262. Transitions 260 and 262 of signal Pulse_1 cause a pulse to appear on signal UP_X as identified by transitions 278 and 268. Signal Slew_1 is generated to indicate the detection and generation of a pulse-limiting condition by pulse width limiter and slew detect 116.

Signal Slew_2 also generated by pulse-width limiter and slew detect 106 goes high 264 in response to the falling edge 262 of signal Pulse_1. Signal Slew_2 remains high until transition 280 appears on signal REF. In response to transition 280, signal Slew_2 goes low 284. Pulse-width limiter and slew detect 108 limits the width of signal Slew_2 to generate pulse-width limited signal Pulse_2, identified by transitions 266 and 270. Transitions 266 and 270 of signal Pulse_2 cause a pulse to appear on signal DN_X as identified by transitions 272 and 274. Signal Slew_2 is generated to indicate the detection and generation of a pulse-limiting condition by pulse width limiter and slew detect 106. As seen from FIG. 7, as a result of the missing pulses on signal REF, an UP_X signal is generated immediately after the DN_X signal, and a second DN_X signal is generated immediately after the UP_X signal. The current generated by charge pump 110 during the time when signal UP_X is high, is twice the amount of current generated during the times when signal DN_X is high.

Figure 8:
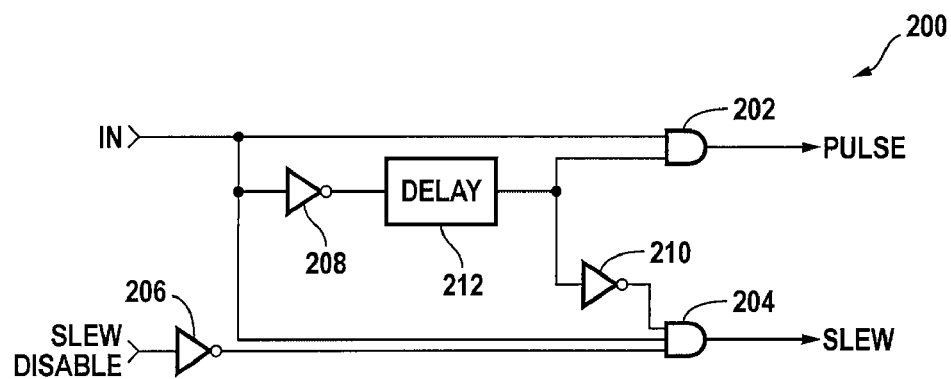
FIG. 8 is an exemplary block diagram of the pulse-width limiter and slew detection block disposed in the PLL of FIG. 6.

FIG. 8 is a block diagram of an exemplary embodiment 200 of pulse-width limiter and slew detect blocks 116 and 106. Pulse-width limiter and slew detect 200 is shown as including AND gates 202, 204, inverters 206, 208, 210 and delay element 212. Signal Pulse is a pulse-limited version of signal IN. Signal Slew is generated to indicate the detection and generation of a pulse-limiting condition. Signal Slew_Disable is used to disable the detection of signal Slew.

The above embodiments of the present invention are illustrative and not limiting. Various alternatives and equivalents are possible. The invention is not limited by the type of pulse-width limiting, slew detection, etc. The invention is not limited by the number of current sources or current sinks. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A circuit comprising:
    a phase/frequency detector;
    a control circuit responsive to the phase/frequency detector and adapted to supply first, second and third control signals, wherein said second control signal is generated after the first control signal is terminated and during a same cycle of a feedback clock signal, and said third control signal is generated after the second control signal is terminated and during the same cycle of a feedback clock signal, wherein a current generated during the second control signal is equal to a sum of currents generated during the first and third control signals, wherein said control circuit comprises:
        a first pulse-width limiting circuit adapted to limit a width of a first signal received from the phase/frequency detector so as to generate a first pulse-width limited signal;
        a second pulse-width limiting circuit adapted to limit a width of a second signal received from the phase/frequency detector so as to generate a second pulse-width limited signal;
        a first slew detector adapted to generate a first slew signal after detecting the first pulse-width limited signal;
        a second slew detector adapted to generate a second slew signal after detecting the first slew signal;
        a third pulse-width limiting circuit adapted to limit a width of the first slew signal so as to generate a third pulse-width limited signal; and
        a fourth pulse-width limiting circuit adapted to limit a width of the second slew signal so as to generate a fourth pulse-width limited signal; and
    a charge pump responsive to said first, second and third control signals.

2. The circuit of claim 1 wherein the current generated during the second control signal is twice the current generated during each of the first and third control signals.

3. The circuit of claim 1 wherein said control circuit further comprises:
    a first logic gate adapted to generate and apply an OR signal of said first and third pulse-width limited signals to the first charge pump; said first OR signal being representative of the first and third control signals; and
    a second logic gate adapted to generate and apply an OR signal of said second and fourth pulse-width limited signals to the first charge pump, said OR signal of the second and fourth signals being representative of the second control signal.

4. The circuit of claim 3 wherein said control circuit is adapted to generate the first, second and third control signals in response to detection of missing pulses of a reference clock.

5. A method of controlling a phase bump of a phased-locked loop, the method comprising:
    detecting a difference between a phase of a reference clock signal and a phase of a feedback clock signal;
    generating first, second and third control signals in response to the detected difference, wherein said second control signal is generated after the first control signal is terminated and during a same cycle of the feedback signal, and said third control signal is generated after the second control signal is terminated and during a same cycle of the feedback signal;
    generating a first current during the first control signal;
    generating a second current during the second control signal; and
    generating a third current during the third control signal; wherein the current generated during the second control signal is equal to a sum of currents generated during the first and third control signals.

6. The method of claim 5 wherein the current generated during the second control signal is twice the current generated during each of the first and third control signals.

7. The method of claim 5 further comprising:
    limiting a width of a first signal received from a phase/frequency detector to generate a first pulse-width limited signal representative of the first control signal;
    generating a first slew signal after detecting the first pulse-width limited signal;
    generating a second slew signal after detecting the first slew signal;
    limiting a width of the first slew signal to generate a third pulse-width limited signal representative of the second control signal; and
    limiting a width of the second slew signal to generate a fourth pulse-width limited signal representative of the third control signal.

8. The method of claim 7 further comprising:
    generating first, second and third control signals in response to detection of missing pulses of a reference clock.

* * * * *